(12) United States Patent
Hara et al.

(10) Patent No.: US 9,192,068 B2
(45) Date of Patent: Nov. 17, 2015

(54) ELECTRIC JUNCTION BOX

(75) Inventors: Yasuhiro Hara, Makinohara (JP);
Takuya Nakayama, Makinohara (JP);
Mitsuru Saito, Makinohara (JP)

(73) Assignee: Yazaki Corporation, Tokyo (JP)

( * ) Notice: Subject to any disclaimer, the term of this patent is extended or adjusted under 35 U.S.C. 154(b) by 550 days.

(21) Appl. No.: 13/528,950

(22) Filed: Jun. 21, 2012

(65) Prior Publication Data

US 2012/0327620 A1   Dec. 27, 2012

(30) Foreign Application Priority Data

Jun. 21, 2011   (JP) ................................ 2011-137132

(51) Int. Cl.
*H05K 5/00* (2006.01)
*H05K 5/04* (2006.01)
*H05K 5/06* (2006.01)
*H05K 7/02* (2006.01)
*B60R 16/023* (2006.01)

(52) U.S. Cl.
CPC ............ *H05K 7/026* (2013.01); *B60R 16/0238* (2013.01)

(58) Field of Classification Search
USPC ............................. 174/50–53; 439/76.1–76.2; 361/775–777, 803, 813, 752–759
See application file for complete search history.

(56) References Cited

U.S. PATENT DOCUMENTS

| | | | |
|---|---|---|---|
| 6,116,916 A * | 9/2000 | Kasai ............................ | 439/76.2 |
| 6,270,359 B1 * | 8/2001 | Kondo et al. ................ | 439/76.2 |
| 6,570,088 B1 * | 5/2003 | Depp et al. ...................... | 174/50 |
| 6,629,619 B2 | 10/2003 | Sato et al. | |
| 6,672,883 B2 * | 1/2004 | Kasai et al. ................... | 439/76.2 |
| 7,558,079 B2 * | 7/2009 | Janisch .......................... | 361/822 |
| 2004/0043647 A1 * | 3/2004 | Takeuchi ...................... | 439/76.2 |
| 2010/0127012 A1 * | 5/2010 | Takeuchi et al. .............. | 220/810 |
| 2010/0307814 A1 * | 12/2010 | Aoki et al. ..................... | 174/520 |

FOREIGN PATENT DOCUMENTS

| | | |
|---|---|---|
| CN | 101742849 A | 6/2010 |
| CN | 101874332 A | 10/2010 |
| JP | 11-122751 A | 4/1999 |
| JP | 2000-4521 A | 1/2000 |
| JP | 2000-050457 A | 2/2000 |

(Continued)

OTHER PUBLICATIONS

Office Action dated Dec. 18, 2014 issued for corresponding Chinese Patent Application No. 201210212529.0.

(Continued)

*Primary Examiner* — Tuan T Dinh
(74) *Attorney, Agent, or Firm* — Locke Lord LLP

(57) ABSTRACT

An electric junction box to prevent fluid such as water infiltrating inside the covers from adhering to a printed wiring board even if the upper cover and lower cover are stacked to each other in an orthogonal direction, comprises a metal board, the surface being arranged in a horizontal direction, and a main body accommodating the metal board. The main body includes an upper cover and a lower cover to be stacked to each other in a direction orthogonal to a surface of the metal board. On a side wall of the lower cover a locking projection is disposed. On a side wall of the upper cover a locking step is disposed with which the locking projection is locked. The upper cover includes an inner wall disposed inside the side wall of the lower cover, the lower end being disposed below the metal board.

4 Claims, 3 Drawing Sheets

(56) References Cited

FOREIGN PATENT DOCUMENTS

| | | | |
|---|---|---|---|
| JP | 2010-200431 A | | 9/2010 |
| WO | WO 2009069271 A1 | * | 6/2009 |

OTHER PUBLICATIONS

Office Action mailed on May 26, 2015 issued for corresponding Japanese Patent Application No. 2011-137132.

* cited by examiner

ELECTRIC JUNCTION BOX

CROSS REFERENCE TO RELATED APPLICATIONS

This application is related to three co-pending applications: "ELECTRICAL JUNCTION BOX" filed even date herewith in the names of YASUHIRO HARA, TAKUYA NAKAYAMA and MITSURU SAITO which claims priority to Japanese Application No. 2011-137134 filed Jun. 21, 2011; "ELECTRIC JUNCTION BOX" filed even date herewith in the names of YASUHIRO HARA, TAKUYA NAKAYAMA and MITSURU SAITO which claims priority to Japanese Application No. 2011-137133 filed Jun. 21, 2011; and "Box Main Body" filed even date herewith in the names of YASUHIRO HARA, TAKUYA NAKAYAMA and MITSURU SAITO which claims priority to Japanese Application No. 2011-137135 filed Jun. 21, 2011; which applications are assigned to the assignee of the present application and all three incorporated by reference herein.

TECHNICAL FIELD

This invention relates to an electric junction box mounted in such an automobile as a mobile body.

BACKGROUND ART

In an automobile as a mobile body, generally, various electric devices are mounted like lamps such as a head lamp and a tale lamp, motors such as a starter motor and an air conditioner motor.

In order to supply power to the aforementioned various electric devices, junction blocks are located optionally in the automobile in position. The junction blocks are integrally composed of various electric circuit units such as a number of fuses or relays.

Note that the junction block is also called fuse block, relay block, or electric junction box collectively because it may include fuses, relays and bas bars. The aforementioned fuse block, relay block, and junction block is hereinafter called electric junction box.

An electric junction box conventionally employed includes a box main body, and a wiring unit accommodated in the main body. The main body is flatly box-shaped. The main body includes a lower cover and an upper cover attached to each other and accommodating a wiring unit. The lower cover and the upper cover are made of isolating synthetic resin and are formed by injection molding.

The wiring unit is provided with a printed wiring board, a plurality of connectors mounted on the printed wiring board, a fuse holder holding a plurality of fuses mounted on the printed wiring board, a plurality of relays mounted on the printed wiring board. Conductive trace of the printed wiring board electrically connects each of terminals of the connector, the fuses, and the relays according to predetermined traces.

The connector is exposed to outside the main body through a through hole passing an outer wall of the main body. At least one of the connectors is engaged with a connector attached to a power cable terminal connected to power source such as a battery or a power generator installed in the automobile. The other connectors are engaged with connectors attached to wire harness terminals connected with various electric devices mounted in the automobile.

The fuse holder is exposed to outside the main body through the through hole passing the outer wall of the main body. The fuse holder has a plurality of fuses. The relay is mounted on the printed wiring board, and accommodated in the main body.

The aforementioned conventional electric junction box makes power supplied from the connector connected from the power source branch into conductive traces of the printed wiring board, pass the aforementioned fuses and the relays, and supply with various electric devices via the wire harness.

SUMMARY OF INVENTION

Technical Problem

The aforementioned conventional electric junction box, while the upper cover and the lower cover are stacked to each other in an orthogonal direction, may be installed in the automobile. Since these covers in this case are formed by injection molding, the through hole for forming a locking part or a lock receiving part for attaching these covers to each other must open upwardly. The aforementioned electric junction box thus poses drawbacks that water infiltrates into the main body through the through hole and that fluid such infiltrating water adheres to the printed wiring board.

Therefore, an object of the present invention is to provide an electric junction box, even if its upper cover and lower cover being stacked to each other in an orthogonal direction, to prevent fluid such as water infiltrating into these covers from adhering to the printed wiring board.

Solution to Problem

In order to resolve the problem and attain the above-mentioned object, an electric junction box according to a first aspect of the present invention comprises: a printed wiring board having a surface arranged in a horizontal direction; a lower cover accommodating the printed wiring board; an upper cover stacked on the lower cover in a direction orthogonal to the surface of the printed wiring board, and attached to the lower cover; a locking part disposed on an outer wall of the lower cover; and a lock receiving part disposed on an outer wall of the upper cover, and configured to be locked with the locking part, wherein the outer wall of the upper cover is stacked on the outer wall of the lower cover, and wherein the upper cover includes an inner wall disposed inside an inner wall of the lower cover, and a lower end of the inner wall of the upper cover is disposed below the printed wiring board.

Preferably, according to a second aspect, in the electric junction box of the first aspect, the lower cover includes a second inner wall disposed inside the inner wall of the upper cover.

Preferably, according to a third aspect, in the electric junction box of the first or second aspect, the lower cover includes a through hole passing through a bottom wall spaced from, and in parallel with, the printed wiring board, and the through hole is formed between the outer wall of the lower cover and the second inner wall.

According to the electric junction box of the first aspect, since the upper cover disposed above the lower cover has the inner wall disposed inside the outer wall of the lower cover disposed inside the outer wall of the upper cover, and its lower end is disposed below the printed wiring board, fluid such water infiltrating into a hole passing the upper cover is designed to adheres to the inner wall. Fluid such water adhering to the inner wall is designed to flow downwardly along the inner wall.

According to the electric junction box of the second aspect, since the lower cover has a through hole passing the bottom wall, fluid such water infiltrating into the inner wall is designed to be drained through the through hole.

According to the invention of the third aspect, the lower cover has the second inner wall disposed inside the inner wall, fluid such water infiltrating into inside the cover crossing the inner wall is designed to block by the second inner wall.

Advantageous Effects of Invention

The present invention as discussed above makes fluid such water infiltrating into the hole passing the upper cover, adhere to the inner wall, and makes the fluid such water adhering to the inner wall flow downwardly along the inner wall. This makes it possible to prevent fluid such water from infiltrating into inside the cover crossing the inner wall, and from adhering to the printed wiring board. Therefore, it is made possible to prevent fluid such water infiltrating into inside the cover from adhering to the printed wiring board even if the upper cover and the lower cover are stacked to each other in an orthogonal direction.

Since the invention of the second aspect makes fluid such water infiltrating into inside the cover to be drained through the trough hole, it is made possible to prevent the fluid from adhering to the printed wiring board.

Since the invention of the third aspect makes fluid such water infiltrating into inside the cover crossing the inner wall to be blocked by the second wall, it is made possible to further securely prevent the fluid from adhering to the printed wiring board.

DESCRIPTION OF EMBODIMENTS

Hereinafter, an electric junction box according to one embodiment of the present invention will be discussed with reference to FIGS. 1 to 4. The electric junction box 1 according to the present embodiment, illustrated in FIG. 1, is installed in an automobile as a mobile body.

Figure 1:
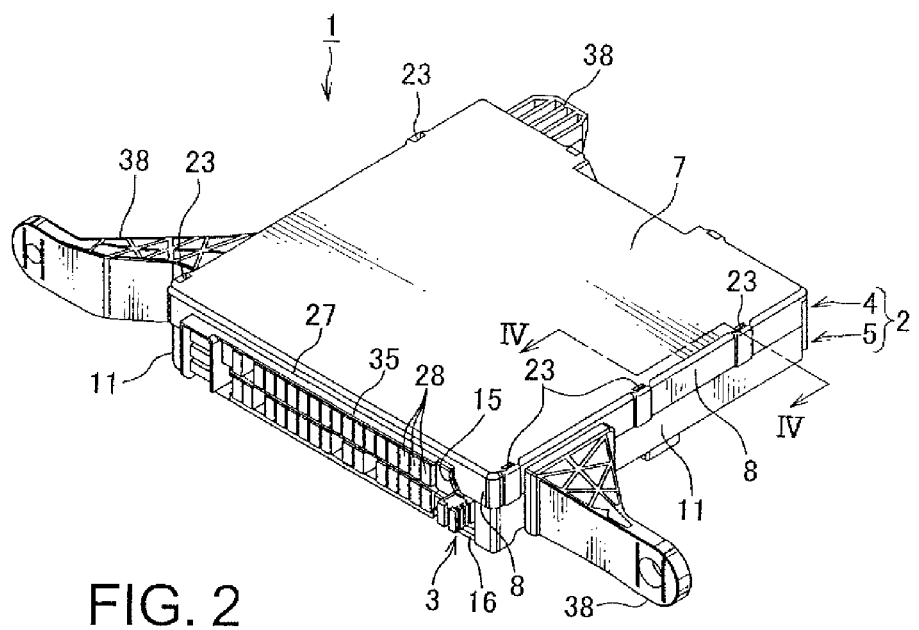
FIG. 1 is a perspective view of an electric junction box according to one embodiment of the present invention.
Figure 3:
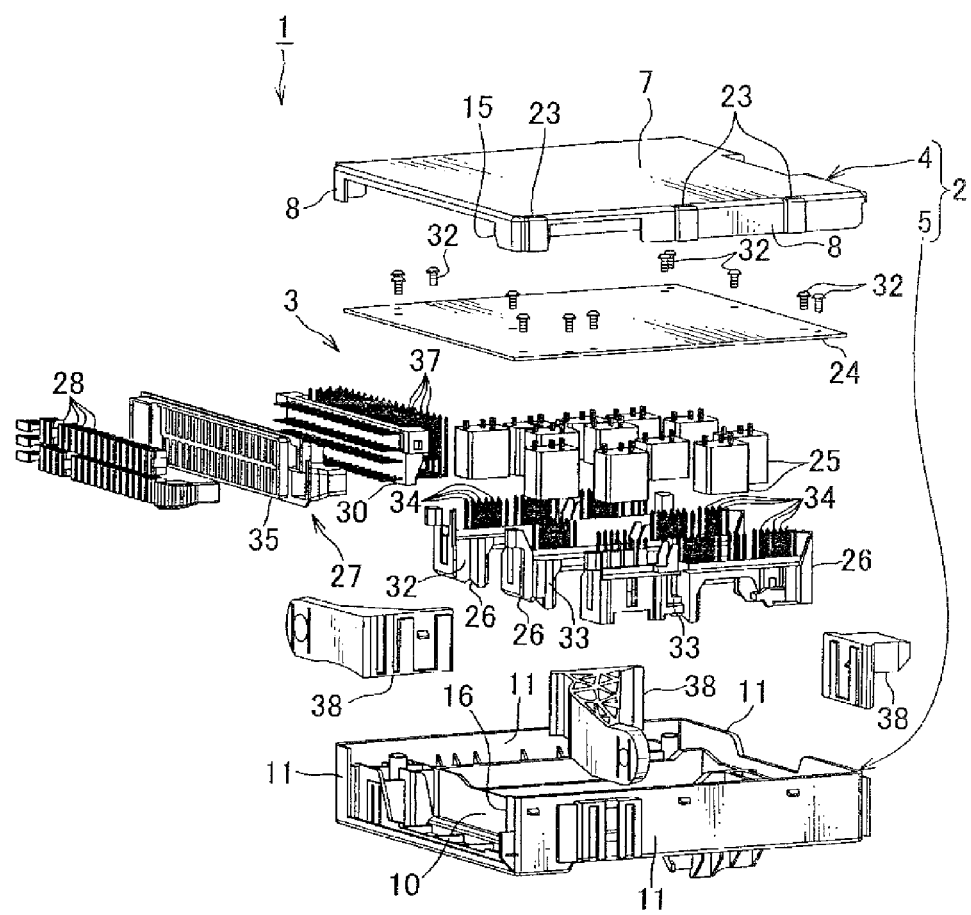
FIG. 3 is an exploded perspective view of the electric junction box illustrated in FIG. 1.

The electric junction box, as shown in FIG. 1, is provided with a main body 2, and a power distributing unit 3 (shown in FIG. 3). Note that in the present embodiment, a direction in which an upper cover 4 and a lower cover 5 of the main body 2 are stacked to each other is called a depth direction Z, a direction which crosses (in orthogonal in the illustrated example) the depth direction Z and in which a plurality of fuses to be mentioned below are each arranged is called a width direction, a direction which crosses (in orthogonal in the illustrated example) both the depth direction Z and the width direction X is called a length direction.

Figure 2:
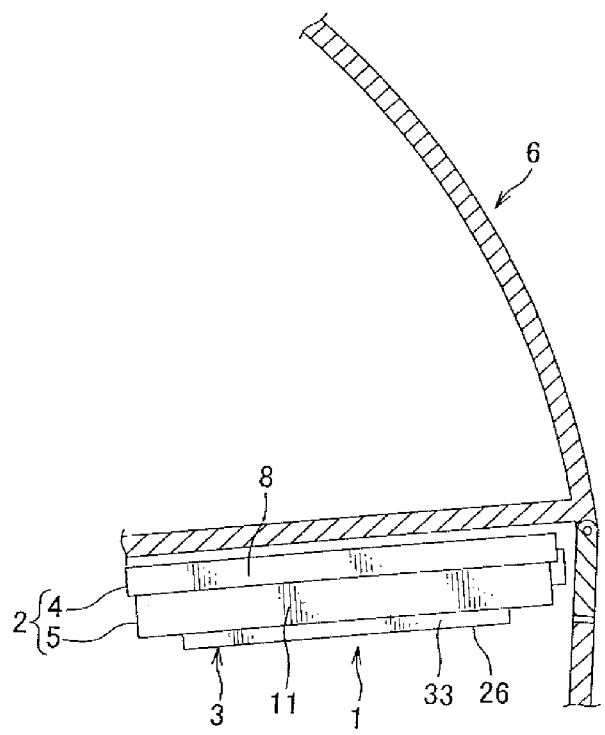
FIG. 2 is an explanation view illustrating a state that the electric junction box illustrated in FIG. 1 is mounted in an automobile.

The electric junction box 1 of the present invention, while the depth direction Z being generally parallel to an orthogonal direction, as shown in FIG. 2, is attached to a lower portion of the center console 6 of the automobile. Note that the electric junction box 1, in the illustrated example, its depth direction Z is slightly inclined to the orthogonal direction in such a way as to gradually approach to down the automobile as approaching to a front of the automobile, and an upper cover 4 is stacked on a lower cover 5 in a direction orthogonal to a surface of a metal board 24 to be mentioned below.

The main body 2 is formed into flat box shape and includes the upper cover 4 and the lower cover 5 to be joined to each other. The upper cover 4 and the lower cover 5 are made of isolating synthetic resin and formed by known injection molding.

Figure 4:
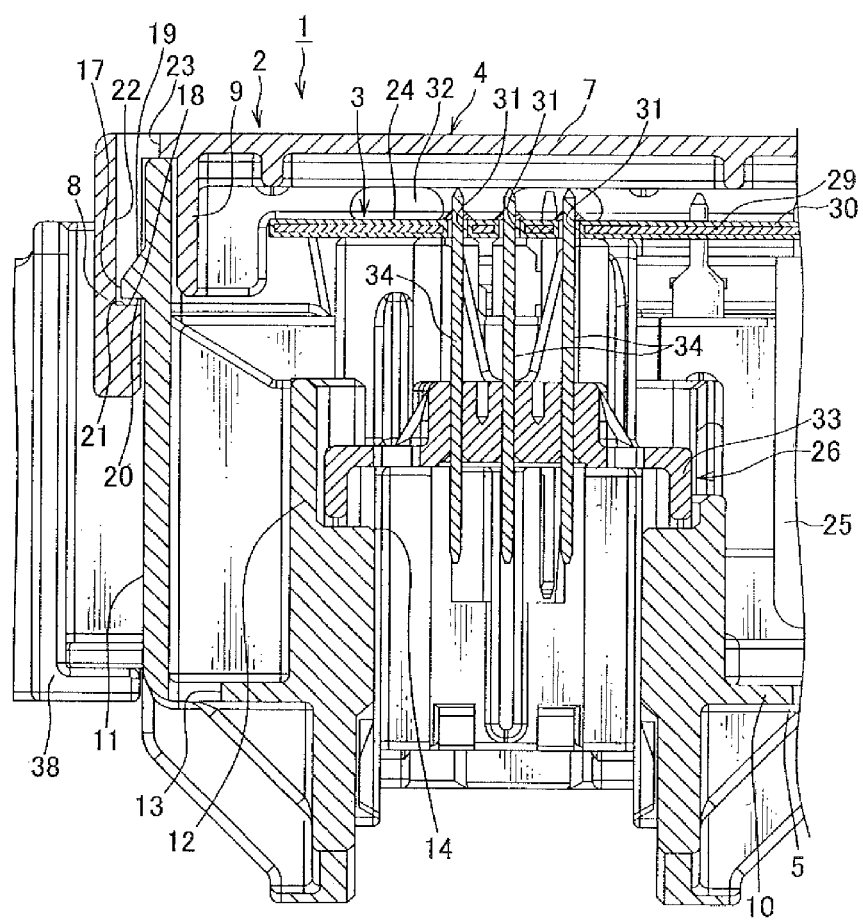
FIG. 4 is a cross-sectional view taken from IV-IV line in FIG. 1.

The upper cover 4 is provided with a generally plane ceiling wall 7, side walls 8 as four outer walls upstanding from each of outer edges of the ceiling wall 7, an inner wall 9 (shown in FIG. 4). The inner wall 9 is disposed inside the side wall 8 and upstands from the ceiling wall 7. The inner wall 9 is disposed spaced from the side wall 8 in parallel and across generally entire circumference of the outer edges of the ceiling wall 7 of the upper cover 4.

The lower cover 5 is provided with a generally plane bottom wall 10, side walls 11 as four outer walls upstanding from each of outer edges of the bottom wall 10, a second inner wall 12 (shown in FIG. 4), and a through hole 13. The bottom wall 10 is provided with a hole 14 (shown in FIG. 4) for exposing a connector 26 to be mentioned below.

The second inner wall 12 disposed inside the side wall 11, and upstands from the bottom wall 10. The second wall 12 is disposed spaced from the side wall 11 in parallel and across generally entire circumference of the outer edges of the bottom wall 10 of the lower cover 5. The second inner wall 12, after the lower cover 4 and the upper cover 5 are attached to each other, is disposed inside the inner wall 9 of the upper cover 4. The through holes 13 are disposed spaced from the outer edges of the bottom wall 10. The through holes 13 pass the bottom wall 10 and opens toward between the side wall 11 and the second inner wall 12.

Of the four side walls 8 and 11 of the upper coven 4 and the lower cover 5, the side walls 8 and 11 in front side in FIGS. 1 and 3 are provided with cut-away portions 15, 16 for exposing fuse plate 35 and fuses 28 attached to the fuse plate 35.

The upper cover 4 and the lower cover 5 are assembled to each other while the ceiling wall 7 and the bottom wall 10 are arranged spaced from each other in parallel, and the outer edges of side wall 8 are stacked on outside the outer edge of the side wall 11. The inner wall 9 is at the same time stacked on an inner surface of the side wall 11 of the lower cover 5. In the present embodiment, as shown in FIG. 4, the lower cover 5 is provided with a locking projection 17 as a locking part, and the upper cover 4 is provided with a lock step 18 as a lock receiving part.

The locking projections 17 are disposed spaced from an outer surface of the side wall 11 of the lower cover 5. The locking projection 17 is formed projected from the side wall 11 of the lower cover 5. The locking projection 17 is formed by a sloped face 19 at a side away form the bottom wall 10, an orthogonal face 20 near the bottom wall 11, and the like. The sloped face 19 is sloped in a direction gradually approaching to an outer face of the side wall 11 as separating from the bottom wall 10. The orthogonal face 20 is orthogonalized to the outer face of the side wall 11.

The locking steps 18 are disposed spaced to each other on an inner face of the side wall 8 of the upper cover 4. The locking steps 18 are formed recessed from the inner face of the side wall 8 of the upper cover 4. The locking steps 18 are disposed on the inner face of the side wall 8 of the upper cover 4 from a middle to the ceiling wall 7 in the depth direction Z, extending straightly in the aforementioned depth direction Z. The locking steps 18 are formed by an orthogonal face 21 away from the ceiling wall 7 and a parallel face 22 near the ceiling wall 7 and the like. The orthogonal face 21 is disposed a middle of the side wall 8 in the depth direction Z and is orthogonalized to the inner face of the side wall 8. The parallel face 22 is disposed from the orthogonal face 21 to the ceiling wall 7, and arranged parallel to the inner face of the side wall 8. The upper cover 4 is provide with a hole 23 for forming the locking steps 18 by injection molding. The hole 23 is positioned lining with the locking steps 18 in the depth direction Z. The hole 23 is passed through the ceiling wall 7.

The aforementioned locking projection 17 and the locking step 18 are locked with each other, while the locking projection 17 entering into the locking step 18, and the orthogonal faces 20 and 21 are overlapped to each other. The locking projection 17 and the locking step 18 are thus locked with each other to assemble the upper cover 4 and the lower cover 5 to each other. Assembling of the upper cover 4 and the lower cover 5 to each other makes the through hole 13 to be arranged down the hole 23 in the orthogonal direction. Note that in the present invention the through hole 13 and the hole 23 are not necessarily required to line in the depth direction Z. Assembling of the upper cover 4 and the lower cover 5 to each other makes a lower end of the inner wall 9 farthest away from the ceiling wall 7 to be disposed below the metal board 24.

The power distribution unit 3, as shown in FIG. 3, is provided with the metal board 24 as the printed wiring board, a plurality of relays 25, a plurality of connectors 26, a fuse holder 27, and a plurality of fuses 28.

The metal board 24 as shown in FIG. 4 is provided with a metal board 29 made of aluminum alloy or copper alloy and the like, an isolating plate 30 made of isolating resin the aforementioned metal board 29 is embedded, and not-shown conductive traces formed on an outer face of the isolating board 30. The metal board 24 as shown in FIG. 4 is provided with a plurality of through holes 31 passing across both surfaces thereof. An inner face of the through hole 31 is covered with synthetic resin composed of the isolating plate 30. The conductive traces of the metal board 24 connect each of the terminals of the connector 26, the relays 25, and the fuses 28 via predetermined traces. The metal board 24, while spaced from, and in parallel with, the ceiling wall 7 and the bottom wall 10, is accommodated in the covers 4 and 5. The metal board 24 is fixed to the lower cover, i.e., the main body 2 with a screw 32 that is threaded into a boss disposed in the lower cover 5. The metal board 24 is thus accommodated in the lower cover 5, i.e., the main body 2, and its surface is arranged in horizontal direction. Note that in the present invention, a horizontal angle with the surface of the metal board 24 being within 0 degrees to tens of degrees is called a state in which the surface of the metal board 24 runs along in the horizontal direction.

The relays 25 are mounted on the metal board 24, and their terminals are connected with the conductive traces of the metal board 24. The connector 26 is provided with an isolating connector housing 33 and a plurality of conductive terminals 34. The connector housing 33 is attached to the metal board 24, and exposed to outside the lower cover 5, i.e., outside the main body 2 via the hole 14 passed through the bottom wall 10. The terminal 34 is supported by the connector housing 33 and is connected to the conductive traces of the metal board 24. To one of the connectors 26, a connector that is attached to power cable terminal connected to the power source in the automobile is engaged. To the other connectors 26 the other connectors that are attached to wire harness terminals connected to various electric devices in the automobile are engaged.

The fuse holder 27, as shown in FIG. 3, is provided with a fuse plate 35, a fuse terminal holder 36, and a plurality of conductive terminals 37. The fuse plate 35 is made of isolating synthetic resin, and the plurality of fuses 28 is attached thereto. The fuse plate 35 covers the cut-away portions 15 and 16 of the upper cover 4 and the lower cover 5, and is attached to these covers 4 and 5 so that the fuses 28 can be exposed. The fuse terminal holder 36 is made of isolating synthetic resin, and is attached to the fuse plate 35.

The terminal 37 is held by the fuse terminal holder 36 and connected with the fuse 28 attached to the fuse plate 35. The terminal 37 is connected to the conductive traces of the metal board 24. The fuse holder 27, while the terminal 37 is connected to the conductive traces of the metal board 24, is mounted to the metal board 24. The plurality of fuses 28 is attached to fuse plate 35 of the fuse holder 27.

The power distribution unit 3 aforementioned branches power from the power source into the conductive traces of the metal board 24, passing power via the fuse 13 or the relay 14, then supplying power with the various electric devices.

The electric junction box 1 aforementioned is provided with a plurality of brackets 38 for fixing the upper cover 4 and the lower cover 5, i.e., the main body 2 to the car body of the automobile.

According to the present embodiment, since the upper cover 4 disposed above the lower cover 5 inside the side wall 11 of the lower cover 5 is arranged inside the side wall 8 of the upper cover 4, and includes the inner wall 9, its lower end being disposed below the metal board 24, fluid such water infiltrating into hole 23 passing the upper cover 4 is designed to adhere to the inner wall 9. Fluid such water adhering to the inner wall 9 is designed to flow downwardly along the inner wall 9. This makes it possible to prevent fluid such water from infiltrating into inside the covers 4 and 5 crossing the inner wall 9, and from adhering to the printed wiring board 24. Therefore, it is also made possible to prevent fluid such water infiltrating into inside the covers 4 and 5 from adhering to the printed wiring board 24 even if the upper cover 4 and the lower cover 5 are stacked to each other in the orthogonal direction.

Since the lower cover 5 has a through hole 13 passing the bottom wall 10, fluid such water infiltrating into the covers 4 and 5 is designed to drain through the through hole 13. This makes it possible to securely prevent the fluid from adhering to the printed wiring board 24.

Since the lower cover 5 has the, second inner wall 12 disposed inside the inner wall 9, fluid such water infiltrating into inside the covers 4 and 5 crossing the inner wall 9 is designed to block by the second inner wall 12. This makes it possible to further securely prevent the fluid from adhering to the metal board 24.

While the aforementioned embodiment shows the metal board 24 as a printed circuit board, what is called a printed board may be employed as printed wiring board in the present invention, whereby conductive traces are formed on an outer surface of the isolating board made of isolating synthetic resin.

It is to be understood the aforementioned embodiment only shows a typical one of the present invention but the present invention is not limited to the examples discussed above. Therefore, unless otherwise such changes and modifications depart from the scope of the present invention hereinafter defined, they should be construed as being included therein.

REFERENCE SIGNS LIST 1 electric junction box
4 upper cover
5 lower cover
8 side wall (outer wall)

9 inner wall
10 bottom wall
11 side wall (outer wall)
12 second inner wall
13 through hole
17 locking projection (locking part)
18 locking step (lock receiving part)
24 metal board (printed wiring board)

The invention claimed is:

1. An electric junction box, comprising:
a printed wiring board having a surface arranged in a horizontal direction having a fuse holder, said fuse holder including a plurality of fuses attached to a fuse plate of the fuse holder;
a lower cover accommodating the printed wiring board;
an upper cover stacked on the lower cover in a direction orthogonal to the surface of the printed wiring board, and attached to the lower cover;
a locking part disposed on an outer wall of the lower cover; and
a lock receiving part disposed on an outer wall of the upper cover, and configured to be locked with the locking part,
wherein an inner surface of the outer wall of the upper cover is stacked on an outer surface of the outer wall of the lower cover, and
wherein the upper cover includes an inner wall stacked on an inner surface of the outer wall of the lower cover, and a lower end of the inner wall of the upper cover is disposed below the printed wiring board;
the electric junction box further comprising with a plurality of brackets for fixing the upper cover and the lower cover of the main body to the car body of an automobile.

2. The electric junction box as claimed in claim 1, wherein the lower cover includes a second inner wall disposed inside the inner wall of the upper cover.

3. The electric junction box as claimed in claim 2, wherein the lower cover includes a through hole passing through a bottom wall spaced from, and in parallel with, the printed wiring board, and the through hole is formed between the outer wall of the lower cover and the second inner wall.

4. The electric junction box as claimed in claim 2, wherein the locking part projects from the outer wall of the lower cover, and comprises a sloped face and an orthogonal face facing a bottom wall of the lower cover; and the lock receiving part is formed to be recessed from the inner surface of the outer wall of the upper cover, and comprises a parallel face and an orthogonal face facing the orthogonal face of the locking part.

\* \* \* \* \*